United States Patent
Kim et al.

(10) Patent No.: US 10,787,752 B2
(45) Date of Patent: Sep. 29, 2020

(54) COPPER FOIL WITH MINIMIZED BAGGINESS, WRINKLE OR TEAR, ELECTRODE INCLUDING THE SAME, SECONDARY BATTERY INCLUDING THE SAME AND METHOD FOR MANUFACTURING THE SAME

(71) Applicant: KCF Technologies Co., Ltd., Anyang-si, Gyeonggi-do (KR)

(72) Inventors: Seung Min Kim, Anyang-si (KR); Jeong Gil Lee, Anyang-si (KR)

(73) Assignee: KCF TECHNOLOGIES CO., LTD., Anyang-si, Gyeonggi-Do (KR)

( * ) Notice: Subject to any disclaimer, the term of this patent is extended or adjusted under 35 U.S.C. 154(b) by 200 days.

(21) Appl. No.: 16/126,470

(22) Filed: Sep. 10, 2018

(65) Prior Publication Data

US 2019/0017188 A1    Jan. 17, 2019

(30) Foreign Application Priority Data

Jul. 13, 2017    (KR) .................. 10-2017-0089031

(51) Int. Cl.

| | |
|---|---|
| *C25D 3/38* | (2006.01) |
| *C25D 5/48* | (2006.01) |
| *C25D 5/16* | (2006.01) |
| *H05K 1/03* | (2006.01) |
| *H05K 3/42* | (2006.01) |
| *C25D 7/06* | (2006.01) |
| *H05K 3/02* | (2006.01) |
| *H05K 3/28* | (2006.01) |
| *C25D 1/04* | (2006.01) |

(52) U.S. Cl.
CPC .............. *C25D 3/38* (2013.01); *C25D 1/04* (2013.01); *C25D 5/16* (2013.01); *C25D 5/48* (2013.01); *C25D 7/0614* (2013.01); *H05K 1/0393* (2013.01); *H05K 3/025* (2013.01); *H05K 3/282* (2013.01); *H05K 3/423* (2013.01); *H05K 2201/0335* (2013.01); *H05K 2203/0723* (2013.01)

(58) Field of Classification Search
None
See application file for complete search history.

(56) References Cited

U.S. PATENT DOCUMENTS

| | | | | |
|---|---|---|---|---|
| 2011/0183207 A1* | 7/2011 | Hirose | ................ | H01M 4/134 429/218.1 |
| 2015/0030873 A1* | 1/2015 | Cheng | ............... | H01M 10/0525 428/606 |

FOREIGN PATENT DOCUMENTS

| | | |
|---|---|---|
| CN | 106480479 A | 3/2017 |
| EP | 3088570 A2 | 11/2016 |
| JP | 2001073171 A | 3/2001 |

(Continued)

OTHER PUBLICATIONS

Japanese Office Action for related Japanese Application No. 2018-153124; action dated Aug. 20, 2019; (3 pages).

(Continued)

*Primary Examiner* — Wyatt P McConnell
(74) *Attorney, Agent, or Firm* — K&L Gates LLP

(57) ABSTRACT

Disclosed is a copper foil including a copper layer and having a tensile strength of 29 to 65 $kgf/mm^2$, a mean width of roughness profile elements (Rsm) of 18 to 148 μm and a texture coefficient bias [TCB(220)] of 0.52 or less.

13 Claims, 6 Drawing Sheets

(56) References Cited

FOREIGN PATENT DOCUMENTS

| | | |
|---|---|---|
| JP | 2009221592 A | 10/2009 |
| JP | 2011-009207 | 1/2011 |
| JP | 2012-022939 | 2/2012 |
| JP | 2013147755 A | 8/2013 |
| JP | 2015183294 A | 10/2015 |
| JP | 2016537514 A | 12/2016 |
| JP | 2018111882 A | 7/2018 |
| KR | 20010067157 A | 7/2001 |
| KR | 100975491 | 8/2010 |
| KR | 101049997 | 7/2011 |
| KR | 101108991 | 1/2012 |
| KR | 20150041577 A | 4/2015 |
| KR | 20170028047 A | 3/2017 |
| KR | 1020170036262 A | 3/2017 |
| KR | 20180054954 A | 5/2018 |
| KR | 20180054985 A | 5/2018 |
| TW | 201700739 A | 1/2017 |
| TW | 201825285 A | 7/2018 |
| WO | 2007105635 A1 | 7/2009 |

OTHER PUBLICATIONS

Taiwan Office Action for related Taiwan Application No. 107128045; action dated May 6, 2019; (13 pages).

Korean Office Action for related Korean Application No. 10-2017-0089031; action dated Feb. 1, 2019; (5 pages).

Mitutoyo; "Quick Guide to Precision Measuring Instruments—Surftest (Surface Roughness Testers"; XP-002785509; retrieve Oct. 8, 2018; https://www.mitutoyo.co.jp/eng/products/menu/QucikGuide_surftest.pdf; (2 pages).

European Search Report for related European Application No. 18188426.3; report dated Oct. 18, 2018; (9 pages).

\* cited by examiner

BAGGINESS

WRINKLE

COPPER FOIL WITH MINIMIZED BAGGINESS, WRINKLE OR TEAR, ELECTRODE INCLUDING THE SAME, SECONDARY BATTERY INCLUDING THE SAME AND METHOD FOR MANUFACTURING THE SAME

CROSS-REFERENCE TO RELATED APPLICATION

Pursuant to 35 U.S.C. § 119(a), this application claims the benefit of earlier filing date and right of priority to Korean Application No. 10-2017-0089031, filed on Jul. 13, 2017, in the Korean Intellectual Property Office, the disclosure of which is hereby incorporated by reference in its entirety.

BACKGROUND OF THE DISCLOSURE

Field of the Disclosure

The present disclosure relates to a copper foil with minimized bagginess, wrinkle or tear, an electrode including the same, a secondary battery including the same, and a method for manufacturing the same.

Description of the Related Art

Copper foils are used to manufacture a variety of products such as anodes for secondary batteries and flexible printed circuit boards (FPCBs).

Meanwhile, a copper foil manufactured by electroplating is referred to as an "electrolytic copper foil". Such an electrolytic copper foil is generally manufactured by a roll-to-roll (RTR) process and the electrolytic copper foil manufactured by a roll-to-roll (RTR) is used to manufacture anodes for secondary batteries and flexible printed circuit boards (FPCBs) via an RTR process. The RTR process is known to be suitable for mass-production because it enables continuous production. However, during the RTR process, a copper foil is folded, torn or suffers bagginess or wrinkles, the operation of RTR equipment should be stopped until such problems are solved, and then the equipment should be operated again, thus causing deterioration in production efficiency.

In particular, when bagginess, wrinkle or tear occurs in a copper foil in the process of manufacturing secondary batteries using the copper foil, it is difficult to stably manufacture products. As such, bagginess, wrinkle or tear occurring in the copper foil in the process of manufacturing secondary batteries results in deterioration in manufacturing yield of secondary batteries and increased manufacture costs of products.

The method, which is known to remove the cause derived from the copper foil, among the causes of bagginess, wrinkle and tear defects occurring in the copper foil is to control the weight deviation of the copper foil to a low level. However, only control over the weight deviation of the copper foil has a limitation in completely solving problems of bagginess, wrinkle and tear occurring during the manufacture of secondary batteries. In particular, recently, in an attempt to increase the capacity of secondary batteries, an ultra-thin copper foil, for example, a copper foil with a thickness of 8 µm or less, is increasingly used as an anode current collector. In this case, although the weight deviation of the copper foil is accurately controlled, bagginess, wrinkle and tear defects intermittently occur in the process of manufacturing secondary batteries. Accordingly, there is a need for preventing or suppressing occurrence of bagginess, wrinkle or tear of copper foils.

SUMMARY OF THE DISCLOSURE

Therefore, the present disclosure has been made in view of the above problems, and it is one object of the present disclosure to provide a copper foil, an electrode including the same, a secondary battery including the same, and a method for manufacturing the same.

It is another object of the present disclosure to provide a copper foil with minimized bagginess, wrinkle or tear. In particular, it is another object of the present disclosure to provide a copper foil that is capable of preventing occurrence of bagginess, wrinkle or tear in the manufacturing process in spite of small thickness and thus provide excellent roll-to-roll (RTR) processability.

It is another object of the present disclosure to provide an electrode for secondary batteries including the copper foil and a secondary battery including the electrode for secondary batteries.

It is another object of the present disclosure to provide a flexible copper foil laminate film including the copper foil.

It is another object of the present disclosure to provide a method for manufacturing a copper foil that is capable of preventing occurrence of bagginess, wrinkle or tear in the manufacturing process.

Apart from the aspects of the present disclosure mentioned above, other features and advantages of the present disclosure will be described below and would be clearly understood from the description by those skilled in the art.

In accordance with the present disclosure, the above and other objects can be accomplished by the provision of a copper foil including a copper layer and having a tensile strength of 29 to 65 kgf/mm$^2$, a mean width of roughness profile elements (Rsm) of 18 to 148 µm, and a texture coefficient bias [TCB(220)] of 0.52 or less.

The copper foil may further include an anticorrosive film disposed on the copper layer.

The anticorrosive film may include at least one of chromium (Cr), a silane compound and a nitrogen compound.

The copper foil may have a maximum height roughness (Rmax) of 0.6 µm or more.

The copper foil may have a weight deviation of 5% or less.

The copper foil may have an elongation of 2% or more at a room temperature of 25±15° C.

The copper foil may have a thickness of 4 µm to 30 µm.

In accordance with another aspect of the present disclosure, there is provided an electrode for secondary batteries including the copper foil according to the present disclosure and an active material layer disposed on the copper foil.

In accordance with another aspect of the present disclosure, there is provided a secondary battery including a cathode, an anode facing the cathode, an electrolyte disposed between the cathode and the anode to provide an environment enabling ions to move, and a separator to electrically insulate (isolate) the cathode from the anode, wherein the anode includes the copper foil according to the present disclosure and an active material layer disposed on the copper foil.

In accordance with another aspect of the present disclosure, there is provided a flexible copper foil laminate film including a polymer membrane and the copper foil according to the present disclosure disposed on the polymer membrane.

In accordance with another aspect of the present disclosure, there is provided a method for manufacturing a copper foil including applying a current density of 30 to 80 A/dm$^2$ to an electrode plate and a rotary electrode drum spaced from each other in an electrolyte containing copper ions to form a copper layer, wherein the electrolyte includes 70 to 100 g/L of copper ions, 80 to 130 g/L of sulfuric acid, 2 to 20 mg/L of 2-mercaptothiazoline, 2 to 20 mg/L of bis-(3-sulfopropyl) disulfide (SPS) and 50 mg/L or less of polyethylene glycol (PEG).

The electrolyte may include 10 to 30 mg/L of chlorine (Cl).

The electrolyte may have a deviation of flow rate per unit time (second) of 5% or less.

The general description of the present disclosure given above is provided only for illustration or description of the present disclosure and should not be construed as limiting the scope of the present disclosure.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
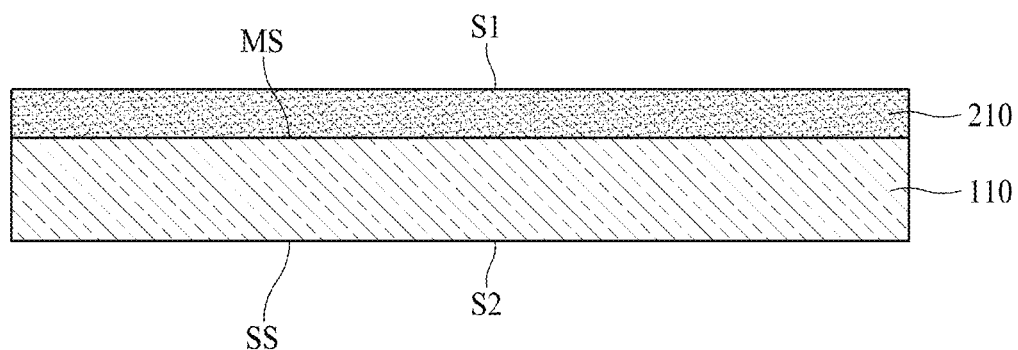
FIG. 1 is a schematic sectional view illustrating a copper foil according to an embodiment of the present disclosure.

Reference will now be made in detail to the preferred embodiments of the present disclosure, examples of which are illustrated in the accompanying drawings.

Those skilled in the art will appreciate that various modifications, additions and substitutions are possible, without departing from the scope and spirit of the disclosure as disclosed in the accompanying claims. Accordingly, the present disclosure encompasses the disclosure defined in claims and modifications and alterations that fall within the scope of the equivalents thereto.

The shapes, sizes, ratios, angles and numbers disclosed in the drawings for describing embodiments of the present disclosure are merely examples, and thus the present disclosure is not limited to the illustrated details. Like reference numerals refer to like elements throughout the specification.

In the case in which "comprise," "have," and "include" described in the present specification are used, another part may also be present unless "only" is used. The terms in a singular form may include plural forms unless noted to the contrary. In construing an element, the element is construed as including an error region although there is no explicit description thereof.

In describing a positional relationship, for example, when the positional order is described as "on," "above," "below," and "next,", at least another part may be present between two parts, unless "just" or "direct" is used.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with one or more items.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

FIG. 1 is a schematic sectional view illustrating a copper foil 100 according to an embodiment of the present disclosure.

Referring to FIG. 1, the copper foil 100 includes a copper layer 110. According to one embodiment of the present invention, the copper foil may further include an anticorrosive film 210 disposed on the copper layer 110. The anticorrosive film 210 may be omitted.

According to the embodiment of the present disclosure, the copper layer 110 has a matte surface MS and a shiny surface SS opposite to the matte surface MS.

Figure 8:
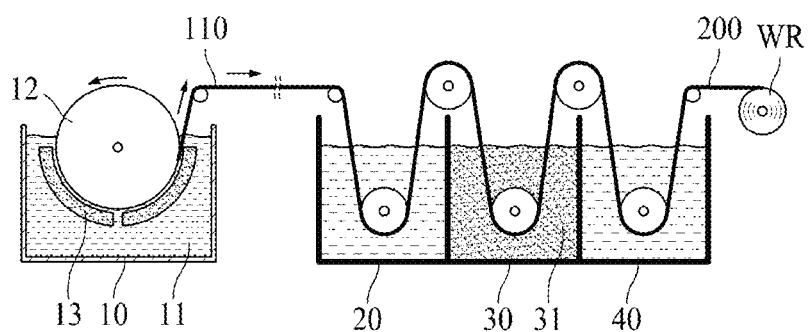
FIG. 8 is a schematic view illustrating a method for manufacturing the copper foil shown in FIG. 3.

The copper layer 110 may be, for example, formed on a rotary electrode drum by electroplating (see FIG. 8). At this time, the shiny surface SS refers to a surface of the copper layer 110 which contacts the rotary electrode drum during electroplating and the matte surface MS refers to a surface which is disposed opposite to the shiny surface SS.

The shiny surface SS generally has a lower surface roughness Rz than that of the matte surface MS, but the embodiment of the present disclosure is not limited thereto. The surface roughness Rz of the shiny surface SS may be equal to or higher than the surface roughness Rz of the matte surface MS.

The anticorrosive film 210 may be disposed on at least one of the matte surface MS and the shiny surface SS of the copper layer 110. Referring to FIG. 1, the anticorrosive film 210 is disposed on the matte surface MS, but the embodiments of the present disclosure are not limited thereto. That is, the anticorrosive film 210 may be disposed only on the shiny surface SS, or both on the matte surface MS and the shiny surface SS.

The anticorrosive film 210 protects the copper layer 110. The anticorrosive film 210 can prevent the copper layer 110 from being oxidized or denatured upon storage. Accordingly, when the anticorrosive film 210 is not disposed on the copper layer 110, the surface of the copper layer 110 is oxidized over time, the lifespan of a device, for example, a secondary battery, including the copper foil 100, may thus be deteriorated. Such an anticorrosive film 210 is also called a "protective layer". There is no particular limitation as to the anticorrosive film 210 and any film or layer may be used as the anticorrosive film 210 so long as it is capable of protecting the copper layer 110.

According to an embodiment of the present disclosure, the anticorrosive film 210 may include at least one of chromium (Cr), a silane compound and a nitrogen compound.

For example, the anticorrosive film 210 may be prepared from a chromium (Cr)-containing anticorrosive liquid, that is, a chromate compound-containing anticorrosive liquid.

According to an embodiment of the present disclosure, the copper foil 100 has a first surface S1 which is a surface of the direction of the matte surface MS based on the copper layer 110 and a second surface S2 which is a surface of the direction of the shiny surface SS. In FIG. 1, the first surface S1 of the copper foil 100 is a surface of the anticorrosive film 210 and the second surface S2 thereof is a shiny surface SS. When the anticorrosive film 210 is not disposed on the copper layer 110, the matte surface of the copper layer 110 corresponds to the first surface S1 of the copper foil 100.

According to an embodiment of the present disclosure, the copper foil 100 has a texture coefficient bias (TCB) of 0.52 or less.

More specifically, the texture coefficient bias of (220) plane [TCB(220)] of the copper foil 100 is 0.52 or less. According to one embodiment of the present disclosure, the texture coefficient bias of (220) plane [TCB(220)] of the copper foil 100 is also called a texture coefficient bias [TCB(220)] of the copper foil 100.

The texture coefficient bias of (220) plane [TCB(220)] indicates a position-dependent deviation or tendency of the texture coefficient of (220) plane [TC(220)]. The texture coefficient bias [TCB(220)] relates to the crystal structure of the surface of the copper foil 100. The texture coefficient bias of (220) plane [TCB(220)] can be calculated in accordance with Equation 1. Specifically, the texture coefficient bias of (220) plane [TCB(220)] is measured three times at respective points of the left, center and right sides in a width direction of the copper foil 100 (see Equation 2 below). Among them, the highest [TC(220)] value is designated by $TC_{max}$ and the lowest [TC(220)] value is designated by $TC_{min}$. The texture coefficient bias [TCB(220)] is calculated by the difference between $TC_{max}$ and $TC_{min}$, that is, the value of "$TC_{max}-TC_{min}$".

Texture coefficient bias[TCB(220)]=$TC_{max}-TC_{min}$ [Equation 1]

Meanwhile, standards used to collect samples in the width direction of the copper foil 100 may be the same as standards used to measure weight deviation.

The texture coefficient bias of (220) plane [TCB(220)] is obtained from the texture coefficient of (220) plane [TC(220)] in accordance with Equation 1.

Hereinafter, referring to FIG. 2, a method for measuring and calculating the texture coefficient of (220) plane [TC(220)] according to the embodiment of the present disclosure will be described below.

Figure 2A:
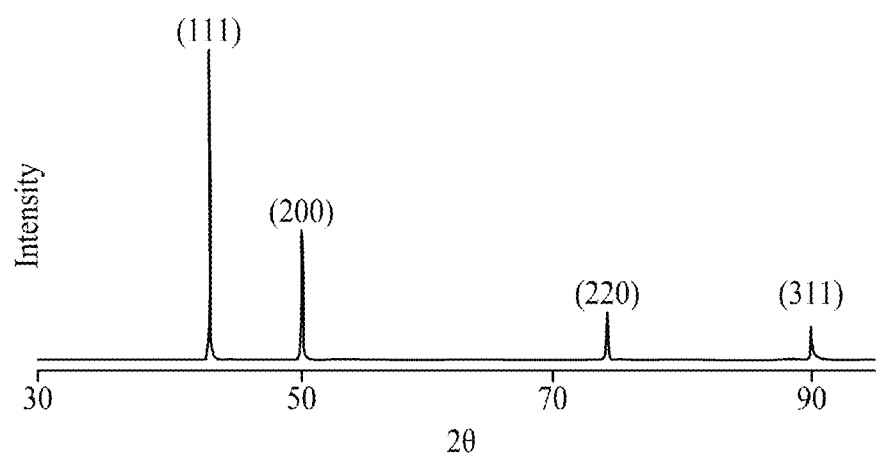
FIG. 2A shows an example of an XRD graph of the copper foil.

FIG. 2A shows an example of an XRD graph of a copper foil. More specifically, FIG. 2A is an XRD graph of the copper foil 100.

For measurement of the texture coefficient of (220) plane [TC(220)], first, an XRD graph having peaks corresponding to n crystal planes is obtained by X-ray diffraction (XRD) in the diffraction angle (2θ) range of 30° to 95° [Target: Copper K alpha 1, 2θ interval: 0.01°, 2θ scan speed: 3°/min]. For example, as illustrated in FIG. 2A, an XRD graph having four peaks corresponding to (111), (200), (220) and (311) planes is obtained. Referring to FIG. 2A, n is 4.

Then, from this graph, XRD diffraction intensity [I(hkl)] of each crystal plane (hkl) is obtained. In addition, XRD diffraction intensities [$I_0$(hkl)] of n respective crystal planes of a standard copper powder regulated by joint committee on powder diffraction standards (JCPDS) are obtained. Subsequently, the arithetic mean value of I(hkl)/$I_0$(hkl) of n crystal planes is calculated and I(220)/$I_0$(220) of (220) plane is divided by the arithmetic mean value to obtain the texture coefficient of (220) plane [TC(220)]. That is, the texture coefficient of (220) plane [TC(220)] is calculated based on the following Equation 2:

$$TC(220) = \frac{\frac{I(220)}{I_0(220)}}{\frac{1}{n}\sum \frac{I(hkl)}{I_0(hkl)}}$$ [Equation 2]

According to an embodiment of the present disclosure, the (220) plane of the copper foil 100 may have a texture coefficient bias [TCB(220)] of 0.52 or less. More specifically, the copper foil 100 may have a texture coefficient [TC(220)] of 0.52 or less.

When the texture coefficient bias (TCB) of the (220) plane is higher than 0.52, the copper foil 100 is readily deformed by tension applied to the copper foil in the process of manufacturing the copper foil by a roll-to-roll process due to difference in local texture caused by difference in local crystal structure, and may thus be wrinkled.

According to one embodiment of the present disclosure, the texture coefficient of (220) plane [TC(220)] should be maintained to a relatively lower level of less than 0.52.

According to an embodiment of the present disclosure, the copper foil 100 has a tensile strength of 29 to 65 kgf/mm$^2$. The tensile strength may be measured with a universal testing machine (UTM) in accordance with the regulations of the IPC-TM-650 test method manual. According to an embodiment of the present disclosure, tensile strength may be measured with a universal testing machine available from Instron corporation. At this time, the width of a sample for measuring tensile strength is 12.7 mm, the distance between grips is 50 mm and measurement speed is 50 mm/min. For evaluation of physical properties, the tensile strength of the sample is repeatedly measured three times and the mean thereof is used as a tensile strength of the copper foil 100.

When the tensile strength of the copper foil 100 is less than 29 kgf/mm$^2$, the copper foil 100 does not withstand force such as tension applied to the copper foil in the manufacturing process and may thus be wrinkled during the roll-to-roll process.

When the tensile strength of the copper foil 100 is higher than 65 kgf/mm$^2$, the copper foil 100 can sufficiently withstand a force such as tension applied thereto in the manufacturing process due to excellent tensile strength thereof, but the copper foil 100 cannot lengthen in response to the force applied locally thereto during the roll-to-roll process due to increased brittleness thereof and may thus be torn.

Accordingly, availability of the copper foil 100 is deteriorated. For example, in the process of producing the copper foil or in the process of producing an electrode for secondary batteries using the copper foil, a tear may occur, which may make it difficult to stably obtain products.

For example, when such tear occurs in the process of manufacturing a copper foil by a roll-to-roll process, the operation of roll-to-roll process equipment should be ceased, the torn copper foil part should be removed and then the process equipment should be operated again. In this case, process time and costs are increased and production efficiency is deteriorated.

According to one embodiment of the present disclosure, the copper foil 100 has a mean width of roughness profile elements (Rsm) of 18 to 148 μm.

The mean width of roughness profile elements (Rsm) can be measured by a roughness tester in accordance with JIS B 0601-2001. Specifically, according to an embodiment of the present disclosure, the mean width of roughness profile elements (Rsm) can be measured with an SJ-310 model commercially available from Mitutoyo Corporation. At this time, a measurement length excluding a cut off length is set to 4 mm and the cut off length is set to 0.8 mm at the beginning and late stages. In addition, the radius of a stylus tip is set to 2 μm.

Figure 2B:
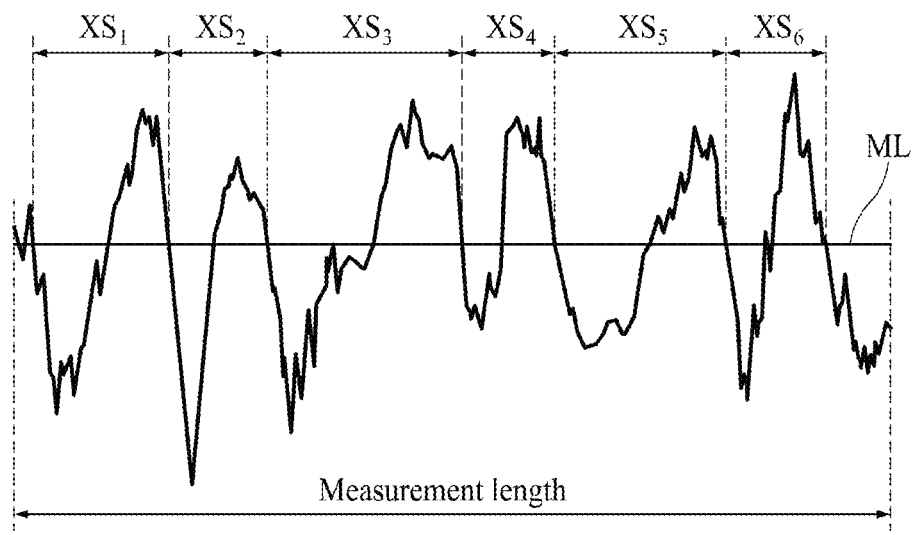
FIG. 2B is a graph showing a roughness profile element.

FIG. 2B is a graph of a roughness profile element.

Referring to FIG. 2B, the mean width of roughness profile elements (Rsm) is an arithmetic mean of the distance (XSi, wherein i=1, 2, 3, . . . m) from a point at which one mountain (valley) crosses a mean line ML to the corresponding point of an adjacent mountain (valley). Specifically, the mean width of roughness profile elements (Rsm) can be calculated by the following Equation 3:

$$Rsm = \frac{1}{m}\sum_{i=1}^{m} XSi \qquad \text{[Equation 3]}$$

The mean width of roughness profile elements (Rsm) is suitable for evaluation of surfaces with regular textures.

When the mean width of roughness profile elements (Rsm) is less than 18 μm, there is a high possibility that tension is concentrated on a certain mountain or valley in the process of manufacturing the copper foil 100 by a roll-to-roll process, because too many mountains (valleys) are present on the surface of the copper foil 100, and thus the copper foil 100 may be easily torn.

On the other hand, when the mean width of roughness profile elements (Rsm) is higher than 148 μm, slip readily occurs in the process of manufacturing the copper foil 100 by a roll-to-roll process because a distance between adjacent mountains is large, and thus the copper foil 100 may be easily wrinkled.

According to one embodiment of the present disclosure, the copper foil 100 has a maximum height roughness (Rmax) of 0.6 μm or more.

The maximum height roughness (Rmax) can be measured by a roughness tester in accordance with JIS B 0601-2001. Specifically, according to an embodiment of the present disclosure, the maximum height roughness (Rmax) can be measured with an SJ-310 model commercially available from Mitutoyo Corporation. Specifically, a measurement length excluding a cut off length is set to 4 mm and the cut off length is set to 0.8 mm at the beginning and late stages. In addition, the radius of a stylus tip is set to 2 μm and a measurement pressure is 0.75 mN.

In the case wherein the maximum height roughness (Rmax) is less than 0.6 μm, when the copper foil 100 is wound on a bobbin or winder, the copper foil 100 is locally lengthened and undergoes bagginess due to weight overlapping of the copper foil 100.

According to one embodiment of the present disclosure, the copper foil 100 may have a maximum height roughness (Rmax) of 3.5 μm or less. When the maximum height roughness (Rmax) of the copper foil 100 is higher than 3.5 μm, when the copper foil 100 is wound on a bobbin or winder in the process of manufacturing the copper foil 100 by a roll-to-roll (RTR) process, air is trapped between copper foils, resulting in bagginess.

According to one embodiment of the present disclosure, the copper foil 100 has a weight deviation of 5% or less. More specifically, the copper foil 100 may have a weight deviation of 0 to 5%. In this case, zero weight deviation means that there is no weight deviation.

According to an embodiment of the present disclosure, the weight deviation can be obtained by a mean of weight values (mean weight) measured at three arbitrary points in a width direction of the copper foil 100 and a standard deviation of the weight values. Specifically, 5 cm×5 cm samples are each obtained at three points arranged along the width direction of the copper foil 100, that is, a direction vertical to the winding direction (transverse direction, TD), the weights of respective samples are measured, the weights per unit area are calculated, "mean weight" and "standard deviation of weight" at the three points are calculated from the weights per unit area of the three samples, and weight deviation is calculated in accordance with the following Equation 4:

$$\text{Weight deviation} = \frac{\text{Standard deviation of weight}}{\text{Mean weight}} \times 100 \qquad \text{[Equation 4]}$$

In the case where the weight deviation of the copper foil 100 is higher than 5%, when the copper foil 100 is wound during the roll-to-roll process, it may be partially lengthened due to weight overlapping in the copper foil 100, causing bagginess of the copper foil 100.

According to one embodiment of the present disclosure, the copper foil 100 has an elongation of 2% or more at a room temperature of 25±15° C. The elongation may be measured with a universal testing machine (UTM) in accordance with the regulations of the IPC-TM-650 test method manual. According to an embodiment of the present disclosure, elongation may be measured with a universal testing machine available from Instron corporation. At this time, the width of a sample for measuring elongation is 12.7 mm, the distance between grips is 50 mm and measurement speed is 50 mm/min. For evaluation of physical properties, the elongation of the sample is repeatedly measured three times and the mean thereof is used as an elongation of the copper foil 100.

When the elongation of the copper foil 100 is less than 2%, the copper foil 100 is not lengthened in response to the force applied in the process of manufacturing the copper foil 100, and is then torn.

More specifically, the copper foil 100 may have an elongation of 2 to 20%.

According to an embodiment of the present disclosure, the copper foil 100 may have a thickness of 4 μm to 30 μm. When the thickness of the copper foil 100 is less than 4 μm, workability is deteriorated in the process of manufacturing the copper foil 100 or a product, for example, an electrode for secondary batteries or a secondary battery, using the copper foil 100. When the thickness of the copper foil 100 is higher than 30 μm, the thickness of the electrode for secondary batteries using the copper foil 100 is increased and there is a difficulty in realizing high-capacity secondary batteries due to the thickness thereof.

According to one embodiment of the present disclosure, bagginess is different from wrinkle.

Figure 9:
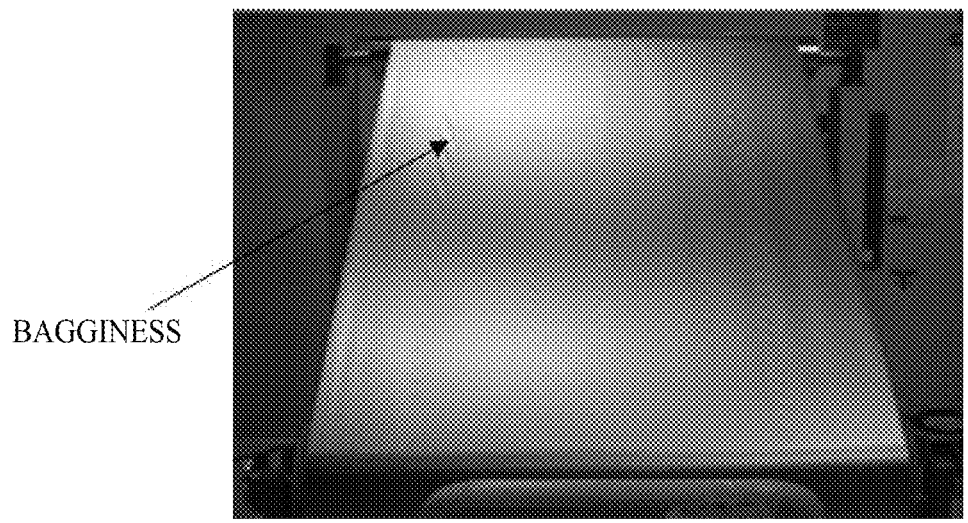
FIG. 9 is an image showing bagginess of a copper foil.

FIG. 9 is an image illustrating bagginess of a copper foil. The part represented by an arrow ( ↗ ) in FIG. 9 means an area where bagginess occurs. According to the embodiment of the present disclosure, bagginess refers to a state or a part in which the copper foil 100 locally lengthens and fails to spread evenly.

Figure 10:
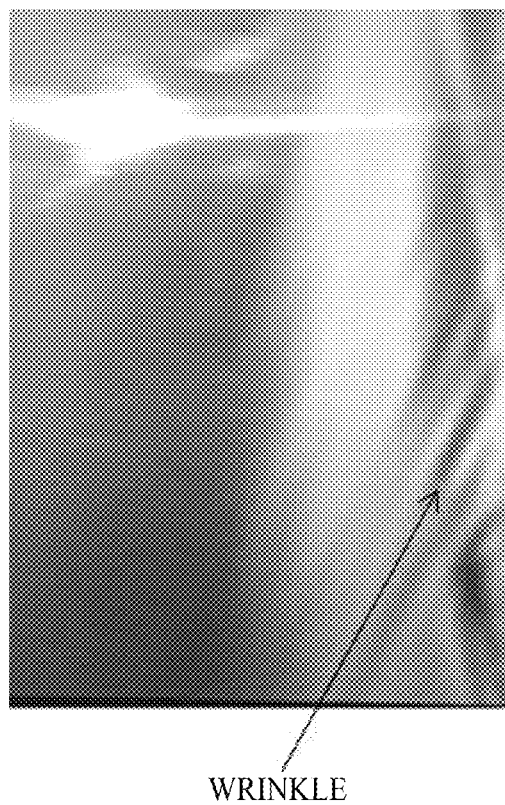
FIG. 10 is an image showing wrinkles of a copper foil.

FIG. 10 is an image illustrating wrinkle of a copper foil. The part represented by an arrow ( ↗ ) in FIG. 10 means an area where wrinkles occur. According to the embodiment of the present disclosure, wrinkle refers to a state or a part in which the copper foil 100 is partially folded.

However, one embodiment of the present disclosure is not limited thereto, and bagginess and wrinkle are not distinguished, and bagginess and wrinkle may have one meaning and be used interchangeably. For example, both a case where the copper foil 100 is locally lengthened and does not flatly spread, and a case where the copper foil 100 is locally folded may be expressed by "bagginess" or "wrinkle".

That is, bagginess and wrinkle are not separately used and may have one meaning and be interchanged.

Figure 3:
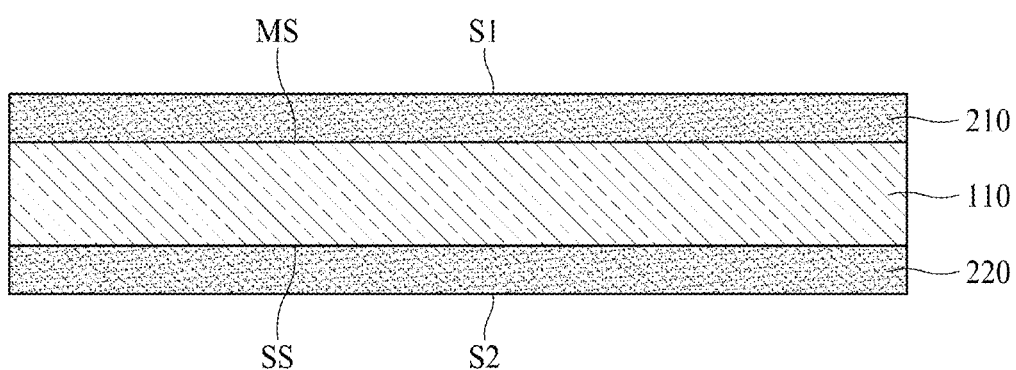
FIG. 3 is a schematic sectional view illustrating a copper foil according to another embodiment of the present disclosure.

FIG. 3 is a schematic sectional view illustrating a copper foil 200 according to another embodiment of the present disclosure. Hereinafter, description of constituent components given above will be omitted to avoid repetition.

Referring to FIG. 3, the copper foil 200 according to another embodiment of the present disclosure includes a copper layer 110, and two anticorrosive films 210 and 220 each disposed on the matte surface MS and the shiny surface SS of the copper layer 110. Compared with the copper foil 100 shown in FIG. 1, the copper foil 200 shown in FIG. 3 further includes an anticorrosive film 220 disposed on the shiny surface SS of the copper layer 110.

For convenience of description, the anticorrosive film 210 disposed on the matte surface MS of the copper layer 110, among two anticorrosive films 210 and 220, is referred to as a "first protective layer" and the anticorrosive film 220 disposed on the shiny surface SS is referred to as a "second protective layer".

In addition, the first surface S1 of the copper foil 200 shown in FIG. 3 is the same as the surface of the anticorrosive film 210 disposed on the matte surface MS, and the second surface S2 is the same as the surface of the anticorrosive film 220 disposed on the shiny surface SS.

According to another embodiment of the present disclosure, each of two anticorrosive films 210 and 220 may include at least one of chromium (Cr), a silane compound and a nitrogen compound.

The (220) plane of the copper foil 200 shown in FIG. has a texture coefficient bias [TCB(220)] of 0.52 or less.

In addition, the copper foil 200 shown in FIG. 3 has a tensile strength of 29 to 65 kgf/mm$^2$ and a mean width of roughness profile elements (Rsm) of 18 to 148 μm. In addition, the copper foil 200 has a maximum height roughness (Rmax) of 0.6 μm or more, a weight deviation of 5% or less, an elongation of 2% or more at a room temperature of 25±15° C. and a thickness of 4 μm to 30 μm.

Figure 4:
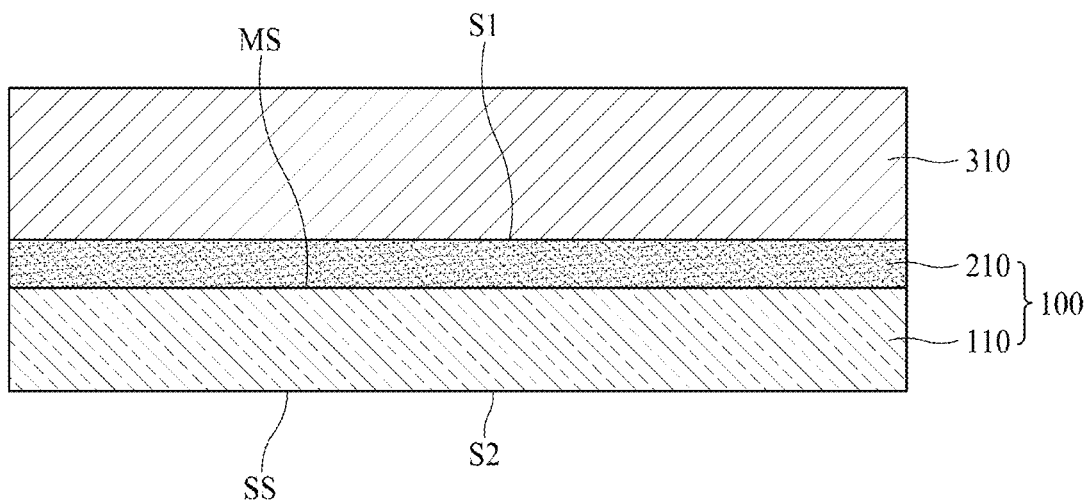
FIG. 4 is a schematic sectional view illustrating an electrode for secondary batteries according to another embodiment of the present disclosure.

FIG. 4 is a schematic sectional view illustrating an electrode 300 for secondary batteries according to another embodiment of the present disclosure.

Figure 6:
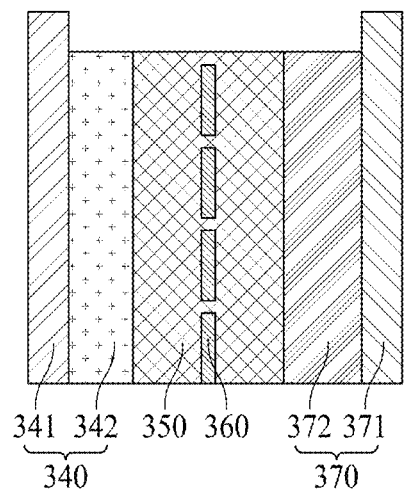
FIG. 6 is a schematic sectional view illustrating a secondary battery according to another embodiment of the present disclosure.

The electrode 300 for secondary batteries shown in FIG. 4 may be, for example, applied to the secondary battery 500 shown in FIG. 6.

Referring to FIG. 4, the electrode 300 for secondary batteries according to another embodiment of the present disclosure includes a copper foil 100 and an active material layer 310 disposed on the copper foil 100. In this case, the copper foil 100 is used as a current collector.

Specifically, the electrode 300 for secondary batteries according to another embodiment of the present disclosure includes a copper foil 100 having a first surface S1 and a second surface S2, and an active material layer 310 disposed on at least one of the first surface S1 and the second surface S2 of the copper foil 100. In addition, the copper foil 100 includes a copper layer 110 and an anticorrosive film 210 disposed on the copper layer 110.

FIG. 4 shows that the copper foil 100 shown in FIG. 1 is used as a current collector. However, the one embodiment of the present disclosure is not limited thereto and the copper foil 200 shown in FIG. 3 may be used as a current collector of the electrode 300 for secondary batteries.

In addition, the configuration in which the active material layer 310 is disposed only on the first surface S1 among the surfaces S1 and S2 of the copper foil 100 is illustrated in FIG. 4, but other embodiments of the present disclosure are not limited thereto. The active material layer 310 may be disposed on both the first surface S1 and the second surface S2 of the copper foil 100, or on only the second surface S2 of the copper foil 100.

The active material layer 310 shown in FIG. 4 includes an electrode active material, in particular, an anode active material. That is, the electrode 300 for secondary batteries shown in FIG. 4 may be used as an anode.

The active material layer 310 may include at least one of carbon, a metal, a metal oxide, and a composite of a metal and carbon. The metal may include at least one of Ge, Sn, Li, Zn, Mg, Cd, Ce, Ni and Fe. In addition, in order to increase charge/discharge capacity of secondary batteries, the active material layer 310 may include silicon (Si).

When the copper foil 100 according to an embodiment of the present disclosure is used, bagginess, wrinkle or tear of the copper foil 100 is prevented in the process of manufacturing the electrode 300 for secondary batteries. Accordingly, the manufacturing efficiency of the electrode 300 for secondary batteries can be improved, and charge/discharge efficiency and capacity maintenance of a secondary battery including the electrode 300 for secondary batteries can be enhanced.

Figure 5:
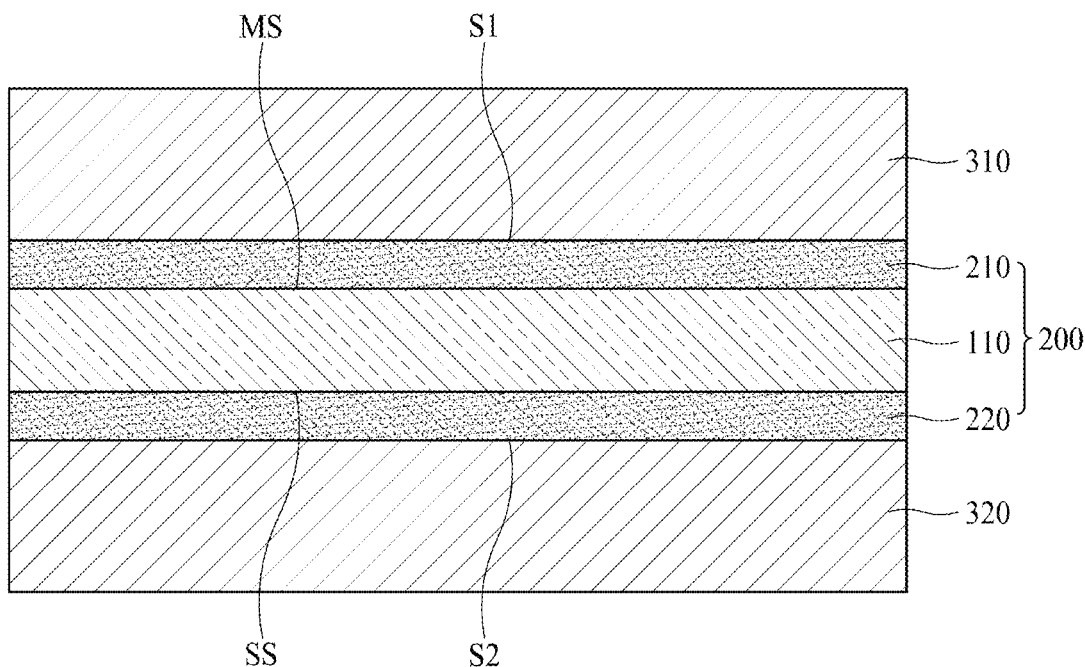
FIG. 5 is a schematic sectional view illustrating an electrode for secondary batteries according to another embodiment of the present disclosure.

FIG. 5 is a schematic sectional view illustrating an electrode 400 for secondary batteries according to another embodiment of the present disclosure.

The electrode 400 for secondary batteries according to another embodiment of the present disclosure includes a copper foil 200, and active material layers 310 and 320 disposed on the copper foil 200.

Referring to FIG. 5, the copper foil 200 includes a copper layer 110, and two anticorrosive films 210 and 220 disposed on opposite surfaces MS and SS of the copper layer 110. In addition, the electrode 300 for secondary batteries shown in FIG. 5 includes two active material layers 310 and 320 disposed on both surfaces of the copper foil 200. Here, the active material layer 310 disposed on the first surface S1 of the copper foil 200 is referred to as a "first active material layer" and the active material layer 320 disposed on the second surface S2 of the copper foil 200 is referred to as a "second active material layer".

The two active material layers 310 and 320 can be produced in the same manner and using the same material, or in different manners and using different materials.

FIG. 6 is a schematic sectional view illustrating a secondary battery 500 according to another embodiment of the present disclosure. The secondary battery 500 shown in FIG. 6 is, for example, a lithium secondary battery.

Referring to FIG. 6, the secondary battery 500 includes a cathode 370, an anode 340 facing the cathode 370, an electrolyte 350 disposed between the cathode 370 and the anode 340 to provide an environment enabling ions to move, and a separator 360 to electrically insulate (isolate) the cathode 370 from the anode 340. Here, the ions that pass through the cathode 370 and the anode 340 are lithium ions. The separator 360 separates the cathode 370 from the anode 340 to prevent current charges generated at one electrode via the secondary battery 500 from moving to another electrode and then being unnecessarily consumed. Referring to FIG. 6, the separator 360 is disposed in the electrolyte 350.

The cathode 370 includes a cathode current collector 371 and a cathode active material layer 372. The cathode current collector 371 is, for example, an aluminum foil.

The anode 340 includes an anode current collector 341 and an active material layer 342. The active material layer 342 of the anode 340 includes an anode active material.

The copper foils 100 and 200 shown in FIGS. 1 and 3 may be used as the anode current collector 341. In addition, the electrodes 300 and 400 for secondary batteries shown in FIGS. 4 and 5, respectively, may be used as the anode 340 of the secondary battery 500 shown in FIG. 6.

Figure 7:
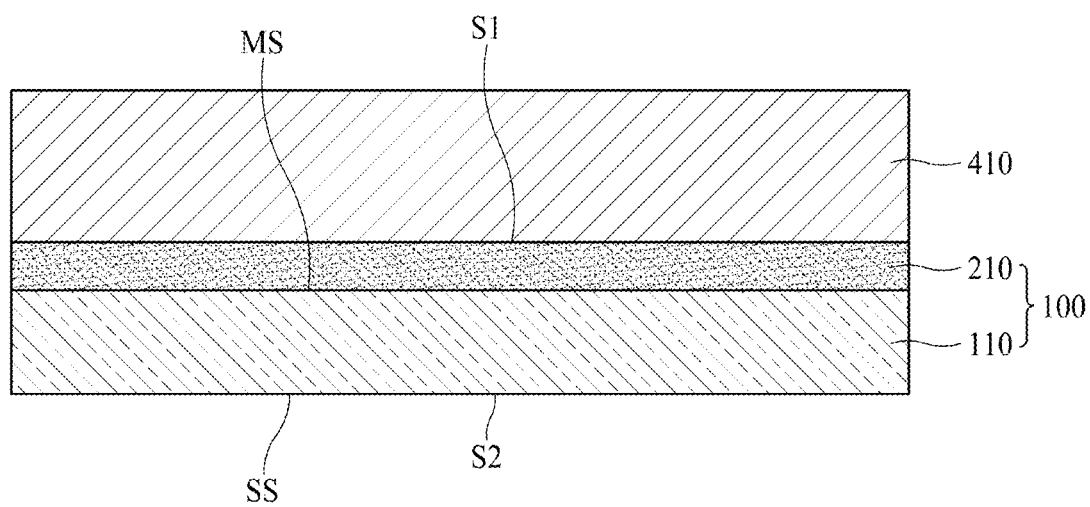
FIG. 7 is a sectional view illustrating a flexible copper foil laminate film according to another embodiment of the present disclosure.

FIG. 7 is a schematic sectional view illustrating a flexible copper foil laminate film 600 according to another embodiment of the present disclosure.

The flexible copper foil laminate film 600 according to another embodiment of the present disclosure includes a polymer membrane 410 and a copper foil 100 disposed on the polymer membrane 410. The flexible copper foil laminate film 600 including the copper foil 100 shown in FIG. 1 is illustrated in FIG. 7, but other embodiments of the present disclosure are not limited thereto. For example, the copper foil 200 shown in FIG. 3 or other copper foil may be used for the flexible copper foil laminate film 600.

The polymer membrane 410 is flexible and non-conductive. There is no particular limitation as to the kind of the polymer membrane 410. The polymer membrane 410, for example, includes polyimide. The flexible copper foil laminate film 600 can be produced by laminating a polyimide film and the copper foil 100 by a roll press. Alternatively, the flexible copper foil laminate film 600 can be produced by coating the copper foil 100 with a polyimide precursor solution and then heat-treating the resulting copper foil 100 as well.

The copper foil 100 includes a copper layer 110 having a matte surface MS and a shiny surface SS, and an anticorrosive film 210 disposed on at least one of the matte surface MS and the shiny surface SS of the copper layer 110. In this case, the anticorrosive film 210 may be omitted.

Referring to FIG. 7, the polymer membrane 410 is disposed on the anticorrosive film 210, but the other embodiment of the present disclosure is not limited thereto. The polymer membrane 410 may be disposed on the shiny surface SS of the copper layer 110.

Hereinafter, a method for manufacturing a copper foil 200 according to another embodiment of the present disclosure will be described in detail with reference to FIG. 8.

FIG. 8 is a schematic view illustrating a method for manufacturing a copper foil 200 shown in FIG. 3.

First, a current density of 30 to 80 ASD (A/dm$^2$) is applied to an electrode plate 13 and a rotary electrode drum 12 spaced from each other in an electrolyte 11 containing copper ions to form a copper layer 110.

Specifically, referring to FIG. 8, the copper layer 110 is formed by electrodeposition of copper on the rotary electrode drum 12 when applying the current density of 30 to 80 ASD (A/dm$^2$) to the electrode plate 13 and the rotary electrode drum 12 disposed in the electrolyte 11 contained in the electrolytic bath 10. At this time, the gap between the electrode plate 13 and the rotary electrode drum 12 can be adjusted to the range of 8 to 13 mm.

As the current density applied to the electrode plate and the rotary electrode drum 12 increases, plating becomes homogeneous and the surface roughness of the matte surface MS of the copper layer 110 is thus decreased. As the current density decreases, plating becomes heterogeneous and the surface roughness of the matte surface MS of the copper layer 110 is thus increased.

The electrolyte 11 contains 70 to 100 g/L of copper ions and 80 to 130 g/L of sulfuric acid. The temperature of the electrolyte 11 is maintained at 50 to 70° C. In the electrolyte 11 having the aforementioned concentrations, copper can be easily deposited on the rotary electrode drum 12.

In addition, the electrolyte 11 includes, as organic substances, 2 to 20 mg/L of 2-mercaptothiazoline, 2 to 20 mg/L of bis-(3-sulfopropyl) disulfide (SPS) and 50 mg/L or less of polyethylene glycol (PEG).

2-mercaptothiazoline is called "MTZ" and can be represented by the following Formula 1.

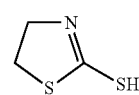

[Formula 1]

2-mercaptothiazoline (MTZ) functions to make crystal grains fine in the process of producing the copper layer 110. When the concentration of 2-mercaptothiazoline (MTZ) in the electrolyte 11 is less than 2 mg/L, formation of fine crystal grains by 2-mercaptothiazoline (MTZ) is insufficient, and tensile strength of the copper foil 200 is less than 29 kgf/mm$^2$. On the other hand, when the concentration of 2-mercaptothiazoline (MTZ) is higher than mg/L, formation of fine crystal grains by 2-mercaptothiazoline (MTZ) is excessive and tensile strength of the copper foil 200 is higher than 65 kgf/mm$^2$.

When the concentration of bis-3-sulfopropyl disulfide (SPS) serving as a luster in the electrolyte 11 is excessively high, i.e., more than 20 mg/L, the surface of the copper layer 110 is excessively uniform, the number of mountains (valleys) per unit width is decreased and the mean width of roughness profile elements (Rsm) of the copper foil 200 is higher than 148 μm. On the other hand, when the concentration of bis-(3-sulfopropyl) disulfide (SPS) is less than 2 mg/L, the surface of the copper layer 110 is non-uniformly formed due to excessively low concentration of the luster to make the surface uniform during copper plating. For this reason, the number of mountains (valleys) per unit width of the copper foil increases and the mean width of roughness profile elements (Rsm) thereof is less than 18 μm.

Polyethylene glycol (PEG) functions to plarnarize the surface of the copper layer 110 during copper plating.

Accordingly, as the concentration of polyethylene glycol (PEG) in the electrolyte 11 increases, evenness of the copper layer 110 increases. When the concentration of polyethylene glycol (PEG) in the electrolyte 11 is higher than 50 mg/L, surface evenness of the copper foil 200 increases and the maximum height roughness (Rmax) of the copper foil 200 is less than 0.6 μm.

The electrolyte 11 includes 50 mg/L or less of silver (Ag). Here, silver (Ag) includes an ionic form (Ag$^+$) dissociated in the electrolyte 11 and a non-dissociated form (Ag), and includes silver (Ag) present in the form of a salt. In general, silver (Ag) in the electrolyte 11 corresponds to impurities. When the concentration of silver (Ag) in the electrolyte 11 is higher than 50 mg/L, copper may be non-uniformly deposited on the rotary electrode drum 12. Accordingly, the concentration of silver (Ag) in the electrolyte 11 is controlled to 50 mg/L or less.

In order for the concentration of silver (Ag) in the electrolyte 11 to be maintained at 50 mg/L or less, the silver (Ag) can be removed by adding chlorine (Cl) to the electrolyte 11 to induce precipitation of silver (Ag) in the form of silver chloride (AgCl). For example, the electrolyte 11 includes 10 to 30 mg/L of chlorine (Cl). Here, chlorine (Cl) includes chlorine ions (Cl$^-$) and chlorine atoms present in molecules. Specifically, chlorine (Cl) can precipitate silver (Ag) ions in the form of silver chloride. Such silver chloride can be removed by filtering.

In order to reduce the content of impurities in the electrolyte 11, copper wires serving as a raw material for the copper ions are heat-treated, the heat-treated copper wires are cleaned with an acid, and the acid-cleaned copper wires are added to sulfuric acid for an electrolyte.

The electrolyte 11 may have a flow rate of 35 to 50 m$^3$/hour. That is, in order to remove solid impurities present in the electrolyte 11 during formation of the copper layer by electroplating, the electrolyte 11 can be circulated at a flow rate of 35 to 50 m$^3$/hour. During circulation of the electrolyte 11, the electrolyte 11 may be filtered. Such filtering enables silver chloride (AgCl) to be removed so that the electrolyte 11 can be kept clean.

According to one embodiment of the present disclosure, a variation in flow rate of the electrolyte 11 per unit time (sec), which is hereinafter referred to as "flow rate deviation", can be controlled to 5% or less. When the flow rate deviation exceeds 5%, a non-uniform copper layer 110 may be formed due to non-homogeneous plating and texture coefficient bias of (220) plane [TCB(220)] of the copper foil 100 exceeds 0.52.

Meanwhile, peroxide and air are incorporated into the electrolyte 11 while the electrolyte 11 is treated with ozone or the copper layer 110 is formed by electroplating, so that clearness of the electrolyte 11 can be maintained or improved.

Then, the copper layer 110 is cleaned in the cleaning bath 20.

In order to remove impurities on the surface of the copper layer 110, the copper layer 110 is cleaned with water in the cleaning bath 20. Alternatively, in order to remove impurities on the surface of the copper layer 110, acid cleaning is conducted and then water cleaning may be conducted to remove the acidic solution used for acid cleaning. The cleaning process may be omitted.

Then, anticorrosive films 210 and 220 are formed on the copper layer 110.

Referring to FIG. 8, the copper layer 110 is dipped in an anticorrosive liquid 31 contained in the anticorrosion bath 30, to form anticorrosive films 210 and 220 on the copper layer 110. Here, the anticorrosive liquid 31 includes chromium and chromium (Cr) is present in the form of an ion in the anticorrosive liquid 31. The anticorrosive liquid 31 may include 0.5 to 5 g/L of chromium. The anticorrosive films 210 and 220 thus formed are referred to as "protective layers".

Meanwhile, the anticorrosive films 210 and 220 may include a silane compound via treatment with silane and a nitrogen compound via treatment with nitrogen.

The copper foil 200 is produced by formation of these anticorrosive films 210 and 220.

Then, the copper foil 200 is cleaned in a cleaning bath 40. Such a cleaning process may be omitted.

Then, a drying process is preformed and the copper foil 200 is then wound on a winder (WR).

Hereinafter, the present disclosure will be described in more detail with reference to Preparation Examples and Comparative Examples. The Preparation examples are only provided only for better understanding of the present disclosure and should not be construed as limiting the scope of the present disclosure.

Preparation Examples 1-6 and Comparative Examples 1-6

A copper foil was produced using a foil making machine which includes an electrolytic bath 10, a rotary electrode drum 12 disposed in the electrolytic bath 10, and an electrode plate 13 spaced from the rotary electrode drum 12. The electrolyte 11 was a copper sulfate solution, the copper ion concentration of the electrolyte 11 was 75 g/L, a sulfuric acid concentration was 100 g/L, a chlorine ion (Cl$^-$) concentration was 17 mg/L, and a temperature of the electrolyte 11 was maintained at 55° C.

The electrolyte 11 included 2-mercaptothiazoline (MTZ), bis-3-sulfopropyl disulfide (SPS) and polyethylene glycol (PEG) in concentrations shown in Table 1. In addition, the electrolyte 11 was circulated at a flow rate of 42 m$^3$/hour and flow rate deviation is shown in Table 1 above.

First, current was applied at a current density of 60 ASD between the rotary electrode drum 12 and the electrode plate 13 to form a copper layer 110.

Then, the copper layer 110 was dipped in the anticorrosive liquid 31 contained in the anticorrosion bath 30 to form anticorrosive films 210 and 220 including chromium on the surface of the copper layer 110. At this time, the temperature of the anticorrosive liquid 31 was maintained at 30° C. and the anticorrosive liquid 31 included 2.2 g/L of chromium (Cr). As a result, copper foils according to Preparation Examples 1-6 and Comparative Examples 1-6 were produced.

TABLE 1

| Items | Flow rate deviation (%) | MTZ (mg/L) | SPS (mg/L) | PEG (mg/L) |
|---|---|---|---|---|
| Preparation Example 1 | 4.8 | 11 | 11 | 25 |
| Preparation Example 2 | 2.8 | 3 | 11 | 25 |
| Preparation Example 3 | 2.8 | 19 | 11 | 25 |
| Preparation Example 4 | 2.8 | 11 | 3 | 25 |
| Preparation Example 5 | 2.8 | 11 | 19 | 25 |

TABLE 1-continued

| Items | Flow rate deviation (%) | MTZ (mg/L) | SPS (mg/L) | PEG (mg/L) |
|---|---|---|---|---|
| Preparation Example 6 | 2.8 | 11 | 11 | 49 |
| Comparative Example 1 | 5.1 | 11 | 11 | 25 |
| Comparative Example 2 | 2.8 | 1 | 11 | 25 |
| Comparative Example 3 | 2.8 | 21 | 11 | 25 |
| Comparative Example 4 | 2.8 | 11 | 1 | 25 |
| Comparative Example 5 | 2.8 | 11 | 21 | 25 |
| Comparative Example 6 | 2.8 | 11 | 11 | 52 |

(i) Texture coefficient bias of (220) plane [TCB(220)], (ii) tensile strength, (iii) mean width of roughness profile elements (Rsm) and maximum height roughness (Rmax) of the copper foils according to Preparation Examples 1-6 and Comparative Examples 1-6 thus produced were measured. Results are shown in Table 2.

(i) Measurement of Texture Coefficient Bias of (220) Plane [TCB(220)]

First, texture coefficient bias of (220) plane [TCB(220)] of copper foils produced in Preparation Examples 1-6 and Comparative Examples 1-6 were measured.

Specifically, copper foils produced in Preparation Examples 1-6 and Comparative Examples 1-6 were subjected to X-ray diffraction (XRD) in the diffraction angle (2θ) range of 30° to 95° [(i) Target: Copper K alpha 1, (ii) 2θ interval: 0.01°, (iii) 2θ scan speed: 3°/min], to obtain an XRD graph having peaks corresponding to n crystal planes, and XRD diffraction intensities [I(hkl)] of respective crystal planes (hkl) were obtained from this graph. In addition, XRD diffraction intensities [$I_0$(hkl)] of respective n crystal planes of a standard copper powder regulated by joint committee on powder diffraction standards (JCPDS) were obtained. In this case, the crystal planes were (111), (200), (220) and (311) planes, and n was 4.

Subsequently, the arithmetic mean value of "I(hkl)/$I_0$(hkl)" of n crystal planes was calculated and I(220)/$I_0$(220) of (220) plane was divided by the arithmetic mean value to obtain the texture coefficient of (220) plane [TC(220)]. That is, the texture coefficient of (220) plane [TC(220)] is calculated based on the following Equation 2:

$$TC(220) = \frac{\frac{I(220)}{I_0(220)}}{\frac{1}{n}\sum \frac{I(hkl)}{I_0(hkl)}} \quad \text{[Equation 2]}$$

The texture coefficient bias of (220) plane [TCB(220)] was measured in accordance with Equation 1 below using the texture coefficient of (220) plane [TC(220)].

Specifically, the texture coefficient bias of (220) plane [TCB(220)] were each measured three times at respective points of the left, center and right sides in a width direction of the copper foil 100 (see Equation 1 below). Among them, the highest [TC(220)] value was designated by $TC_{max}$ and the lowest [TC(220)] value was designated by $TC_{min}$. The texture coefficient bias [TCB(220)] was calculated by the difference between $TC_{max}$ and $TC_{min}$, that is, the value of "$TC_{max} - TC_{min}$".

Texture coefficient bias [TCB(220)]=$TC_{max}$−$TC_{min}$ [Equation 1]

(ii) Measurement of Tensile Strength

The tensile strengths of copper foils produced in Preparation Examples 1-6 and Comparative Examples 1-6 were measured using a universal testing machine in accordance with the specifications of the IPC-TM-650 test method manual. The width of the measurement sample of tensile strength was 12.7 mm, the distance between grips was 50 mm and the measurement speed was 50 mm/min. The tensile strength of the sample was repeatedly measured three times and the mean thereof was evaluated as a measurement result.

(iii) Measurement of Mean Width of Roughness Profile Elements (Rsm)

The mean width of roughness profile elements (Rsm) was measured using a roughness tester in accordance with JIS B 0601-2001. Specifically, according to an embodiment of the present disclosure, the mean width of roughness profile elements could be measured with an SJ-310 model commercially available from Mitutoyo Corporation. At this time, a measurement length excluding a cut off length was set to 4 mm and the cut off length was set to 0.8 mm at the beginning and late stages. In addition, the radius of a stylus tip was set to 2 μm.

Assuming that the distance from a point at which one mountain (valley) crosses a mean line ML to the corresponding point of adjacent mountain (valley) is designated by "XSi", the mean width of roughness profile elements (Rsm) can be obtained by the following Equation 3.

$$Rsm = \frac{1}{m}\sum_{i=1}^{m} XSi \quad \text{[Equation 3]}$$

(iv) Measurement of Maximum Height Roughness (Rmax)

The maximum height roughness (Rmax) was measured by a roughness tester in accordance with JIS B 0601-2001. Specifically, according to an embodiment of the present disclosure, the maximum height roughness (Rmax) was measured with an SJ-310 model commercially available from Mitutoyo Corporation. At this time, a measurement length excluding a cut off length was set to 4 mm and the cut off length was set to 0.8 mm at the beginning and late stages. In addition, the radius of a stylus tip was set to 2 μm and a measurement pressure was 0.75 mN. After the setting as described, the measurement value of maximum height roughness (Rmax) was obtained, based on the value measured with the Mitutoyo roughness tester.

(v) Observation of Occurrence of Bagginess, Wrinkle or Tear

1) Anode Production 100 parts by weight of carbon as a commercially available anode active material was mixed with 2 parts by weight of styrene butadiene rubber (SBR) and 2 parts by weight of carboxymethyl cellulose (CMC), and a slurry for an anode active material was prepared using distilled water as a solvent. Copper foils with a width of 10 cm produced in Preparation Examples 1-6 and Comparative Examples 1-6 were coated to a thickness of 40 μm with the slurry for an anode active material using a doctor blade, dried at 120° C., and pressed at a pressure of 1 ton/cm² to produce an anode for secondary batteries.

2) Electrolyte Production $LiPF_6$ as a solute was dissolved at a concentration of 1M in a non-aqueous organic solvent consisting of ethylene carbonate (EC) and ethyl methyl carbonate (EMC) mixed in a ratio of 1:2 to prepare a basic electrolyte. 99.5% by weight of the basic electrolyte was mixed with 0.5% by weight of succinic anhydride to prepare a non-aqueous electrolyte.

3) Cathode Production

Lithium manganese oxide ($Li_{1.1}Mn_{1.85}Al_{0.05}O_4$) was mixed with lithium manganese oxide (o-$LiMnO_2$) having an orthorhombic crystal structure in a weight ratio of 90:10 to produce a cathode active material. The cathode active material, carbon black, and PVDF [poly(vinylidene fluoride)] as a binder were mixed in a weight ratio of 85:10:5, and the resulting mixture was mixed with NMP as an organic solvent to prepare a slurry. Both surfaces of an Al foil with a thickness of 20 μm were coated with the slurry thus prepared and dried to produce a cathode.

4) Production of Lithium Secondary Battery for Testing

The cathode and the anode were disposed in an aluminum can such that the cathode and the anode were insulated with the aluminum can, and a non-aqueous electrolyte and a separator were disposed to produce a coin-type lithium secondary battery. As the separator, polypropylene (Celgard 2325; thickness 25 μm, average pore size φ28 nm, porosity 40%) was used.

5) Observation of Occurrence of Bagginess, Wrinkle or Tear.

In a series of processes of manufacturing a lithium secondary battery, whether or not tear, wrinkle or bagginess of the copper foil occurred was observed. In particular, in the process of producing the copper foil and the anode, whether or not tear, wrinkle or bagginess of the copper foil occurred was observed by the naked eye. The case in which bagginess, wrinkle or tear did not occur was designated as "good". The evaluation and observation results are shown in the following Table 2:

TABLE 2

|  | TCB (220) (%) | Tensile strength (kgf/mm²) | Rsm (μm) | Rmax (μm) | Wrinkle | Tear | Bagginess |
|---|---|---|---|---|---|---|---|
| Preparation Example 1 | 0.51 | 46.2 | 76 | 1.70 | Good | Good | Good |
| Preparation Example 2 | 0.21 | 29.4 | 76 | 1.75 | Good | Good | Good |
| Preparation Example 3 | 0.21 | 64.7 | 76 | 1.75 | Good | Good | Good |
| Preparation Example 4 | 0.21 | 46.2 | 19 | 1.74 | Good | Good | Good |
| Preparation Example 5 | 0.21 | 46.2 | 147 | 1.75 | Good | Good | Good |
| Preparation Example 6 | 0.21 | 46.2 | 76 | 0.62 | Good | Good | Good |
| Comparative Example 1 | 0.53 | 46.2 | 76 | 1.70 | Wrinkle | Good | Good |
| Comparative Example 2 | 0.21 | 28.5 | 76 | 1.75 | Wrinkle | Good | Good |
| Comparative Example 3 | 0.21 | 65.8 | 76 | 1.75 | Good | Tear | Good |
| Comparative Example 4 | 0.21 | 46.2 | 17 | 1.74 | Good | Tear | Good |
| Comparative Example 5 | 0.21 | 46.2 | 149 | 1.75 | Wrinkle | Good | Good |
| Comparative Example 6 | 0.21 | 46.2 | 76 | 0.55 | Good | Good | Bagginess |

In the process of manufacturing copper foils and producing lithium secondary batteries according to Comparative Examples 1-6, bagginess, wrinkle or tear of copper foils occurred. On the other hand, in the process of manufacturing copper foils and producing lithium secondary batteries according to Preparation Examples 1-6, bagginess, wrinkle or tear of copper foils did not occur.

Specifically, in the subsequent process of manufacturing a lithium secondary battery using the copper foil, bagginess or tear of the copper foil occurred.

Comparative Example 1 in which the flow rate deviation is higher than 5% and the texture coefficient bias of (220) plane [TCB(220)] is higher than 0.52 (occurrence of wrinkle).

Comparative Example 2 in which the concentration of 2-mercaptothiazoline is less than 1 mg/L and tensile strength is less than 29 kgf/mm² (occurrence of wrinkle).

Comparative Example 3 in which the content of mercaptothiazoline (MTZ) in the electrolyte was higher than mg/L and tensile strength was higher than 65 kgf/mm² (occurrence of tear).

Comparative Example 4 in which the content of bis-3-sulfopropyl disulfide (SPS) in the electrolyte is less than mg/L and the mean width of roughness profile elements (Rsm) is less than 18 μm (occurrence of tear).

Comparative Example 5 in which the content of bis-3-sulfopropyl disulfide (SPS) in the electrolyte is higher than 21 mg/L and the mean width of roughness profile elements (Rsm) is less than 148 μm (occurrence of wrinkle).

Comparative Example 6 in which the content of polyethylene glycol (PEG) in the electrolyte was less than 50 mg/L and the maximum height roughness (Rmax) was less than 0.6 μm (occurrence of bagginess).

The copper foils according to Comparative Examples 1 to 6 were unsuitable for anode current collectors for lithium secondary batteries.

On the other hand, Preparation Examples 1 to 6 produced under the conditions according to the embodiments of the present disclosure could avoid bagginess, tear and wrinkle of the copper foil in the process of manufacturing the copper foil or in the process of manufacturing a lithium secondary battery using the copper foil. Accordingly, copper foils according to embodiments of the present disclosure had excellent roll-to-roll (RTR) processability and were suitable for anode current collectors for lithium secondary batteries.

The copper foils according to the embodiments of the present disclosure are highly resistant to bagginess, wrinkle or tear. Accordingly, according to an embodiment of the present disclosure, in the process of manufacturing copper foils or in the process of manufacturing secondary batteries using the copper foils, occurrence of bagginess, wrinkle or tear is prevented. The copper foils according to embodiments of the present disclosure have excellent roll-to-roll (RTR) processability.

In addition, according to another embodiment of the present disclosure, an electrode for secondary batteries in which occurrence of bagginess, wrinkle or tear is prevented or minimized can be produced.

It will be apparent to those skilled in the art that the present disclosure described above is not limited by the above-described embodiments and the accompanying drawings and that various substitutions, modifications, and variations can be made in the present disclosure without departing from the spirit and scope of the disclosures. Consequently, the scope of the present disclosure is defined by the accompanying claims, and it is intended that all variations and modifications derived from the meaning, scope, and equivalent concept of the claims fall within the scope of the present disclosure.

What is claimed is:

1. A copper foil comprising a copper layer and having a tensile strength of 29 to 65 kgf/mm², a mean width of roughness profile elements (Rsm) of 18 to 148 µm and a texture coefficient bias [TCB(220)] of 0.52 or less.

2. The copper foil according to claim 1, further comprising an anticorrosive film disposed on the copper layer.

3. The copper foil according to claim 2, wherein the anticorrosive film comprises at least one of chromium (Cr), a silane compound and a nitrogen compound.

4. The copper foil according to claim 1, wherein the copper foil has a maximum height roughness (Rmax) of 0.6 µm or more.

5. The copper foil according to claim 1, wherein the copper foil has a weight deviation of 5% or less.

6. The copper foil according to claim 1, wherein the copper foil has an elongation of 2% or more at a room temperature of 25±15° C.

7. The copper foil according to claim 1, wherein the copper foil has a thickness of 4 µm to 30 µm.

8. An electrode for secondary batteries comprising:
the copper foil according to claim 1; and
an active material layer disposed on the copper foil.

9. A secondary battery comprising:
a cathode;
an anode facing the cathode;
an electrolyte disposed between the cathode and the anode to provide an environment enabling ions to move; and
a separator to electrically insulate (isolate) the cathode from the anode,
wherein the anode comprises:
the copper foil according to claim 1; and
an active material layer disposed on the copper foil.

10. A flexible copper foil laminate film comprising:
a polymer membrane; and
the copper foil according to claim 1 disposed on the polymer membrane.

11. A method for manufacturing a copper foil comprising applying a current density of 30 to 80 A/dm$^2$ to a electrode plate and a rotary electrode drum spaced from each other in an electrolyte containing copper ions to form a copper layer, wherein the electrolyte comprises:
70 to 100 g/L of copper ions;
80 to 130 g/L of sulfuric acid;
2 to 20 mg/L of 2-mercaptothiazoline;
2 to 20 mg/L of bis-(3-sulfopropyl) disulfide (SPS); and
50 mg/L or less of polyethylene glycol (PEG).

12. The method according to claim 11, wherein the electrolyte comprises 10 to 30 mg/L of chlorine (Cl).

13. The method according to claim 11, wherein the electrolyte has a deviation of flow rate per unit time (second) of 5% or less.

* * * * *